(12) United States Patent
Watanabe et al.

(10) Patent No.: US 10,998,491 B2
(45) Date of Patent: May 4, 2021

(54) MAGNETORESISTIVE ELEMENT AND MAGNETIC MEMORY

(71) Applicant: TOHOKU UNIVERSITY, Miyagi (JP)

(72) Inventors: Kyota Watanabe, Miyagi (JP); Shunsuke Fukami, Miyagi (JP); Hideo Sato, Miyagi (JP); Hideo Ohno, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/971,262

(22) PCT Filed: Feb. 6, 2019

(86) PCT No.: PCT/JP2019/004299
§ 371 (c)(1),
(2) Date: Aug. 19, 2020

(87) PCT Pub. No.: WO2019/187674
PCT Pub. Date: Oct. 3, 2019

(65) Prior Publication Data
US 2021/0098689 A1     Apr. 1, 2021

(30) Foreign Application Priority Data
Mar. 30, 2018   (JP) .............. JP2018-069879

(51) Int. Cl.
*H01L 43/02* (2006.01)
*H01F 10/32* (2006.01)
(Continued)

(52) U.S. Cl.
CPC ............ *H01L 43/02* (2013.01); *G11C 11/161* (2013.01); *H01F 10/3254* (2013.01);
(Continued)

(58) Field of Classification Search
CPC .... H01L 43/02; G11C 11/161; H01F 10/3254
(Continued)

(56) References Cited

U.S. PATENT DOCUMENTS

| | | | |
|---|---|---|---|
| 6,853,520 B2* | 2/2005 | Fukuzawa | H01L 43/08 360/324.1 |
| 2002/0048128 A1* | 4/2002 | Kamiguchi | G11B 5/3903 360/324.1 |

(Continued)

FOREIGN PATENT DOCUMENTS

| | | |
|---|---|---|
| JP | 2008252037 A | 10/2008 |
| JP | 2012064625 A | 3/2012 |

(Continued)

OTHER PUBLICATIONS

International Preliminary Report on Patentability for related PCT App No. PCT/JP2019/004299 dated Sep. 24, 2019, 22 pgs.
(Continued)

*Primary Examiner* — Jami Valentine Miller
(74) *Attorney, Agent, or Firm* — Procopio, Cory, Hargreaves & Savitch LLP

(57) ABSTRACT

A magnetoresistance effect element is provided, which can, even in a region where the element size of the magnetoresistance effect element is small, implement stable record holding at higher temperatures, and moreover which has higher thermal stability.

The magnetoresistance effect element has a configuration including reference layer (B1)/first non-magnetic layer (1)/first magnetic layer (21)/first non-magnetic insertion layer (31)/second magnetic layer (22). A magnetostatic coupling is established between the first magnetic layer (21) and the second magnetic layer (22) due to magnetostatic interaction becoming dominant.

19 Claims, 9 Drawing Sheets

(51) Int. Cl.
*G11C 11/16* (2006.01)
*H01L 43/10* (2006.01)

(52) U.S. Cl.
CPC ........ *G11C 11/1653* (2013.01); *H01F 10/329* (2013.01); *H01F 10/3286* (2013.01); *H01L 43/10* (2013.01)

(58) Field of Classification Search
USPC ....... 257/20, 414, 421–427, E29.323; 438/3; 360/324–326, 313; 365/157–158, 365/171–173
See application file for complete search history.

(56) References Cited

U.S. PATENT DOCUMENTS

| | | | |
|---|---|---|---|
| 2002/0048690 A1* | 4/2002 | Fukuzawa | G11B 5/66 428/811 |
| 2012/0063221 A1 | 3/2012 | Yamane et al. | |
| 2013/0075845 A1 | 3/2013 | Chen et al. | |
| 2013/0094284 A1* | 4/2013 | Ohno | H01L 43/10 365/158 |
| 2015/0109853 A1* | 4/2015 | Sato | G11C 11/161 365/158 |
| 2017/0222132 A1* | 8/2017 | Pinarbasi | H01L 43/12 |

FOREIGN PATENT DOCUMENTS

| | | |
|---|---|---|
| JP | 2014530503 A | 11/2014 |
| WO | 2016178758 A1 | 11/2016 |
| WO | 2017131894 A1 | 8/2017 |

OTHER PUBLICATIONS

Ikeda, S., et al., A Perpendicular-Anisotropy CoFeB—MgO Magnetic Tunnel Junction, Nature Materials, 2010, 9, pp. 721-724.

Sato, H., et al., Perpendicular-Anistropy CoFeB—MgO Magnetic Tunnel Junctions with a MgO/CoFeB/Ta/CoFeB/MgO Recording Structure, Applied Physics Letters, 2012, 101, 022414, 5 pgs.

Sato, H., et al., Properties of Magnetic Tunnel Junctions with a MgO/CoFeB/Ta/CoFeB/MgO Recording Structure Down to Junction Diameter of 11 nm, Applied Physics Letters, 2014, 105, 062403, 5 pgs.

Written Opinion of related PCT App No. PCT/JP2019/004299 dated Apr. 23, 2019, 5 pgs.

International Preliminary Report on Patentability for related PCT App No. PCT/JP2019/004299 dated Sep. 24, 2019, 17 pgs.

\* cited by examiner

Fig. 1
Fig. 1(a)　　　　　　　　　　　　　　Fig. 1(b)
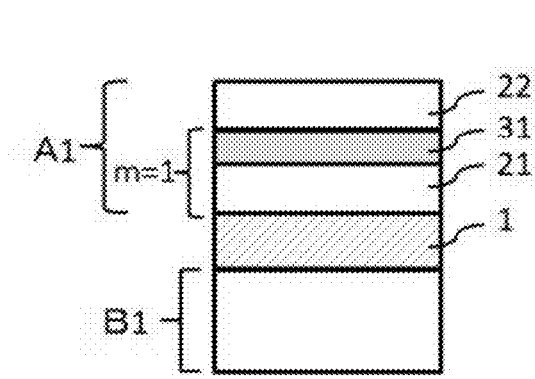
Fig. 2
Fig. 2(a)　　　　　　　　　　　　　　Fig. 2(b)
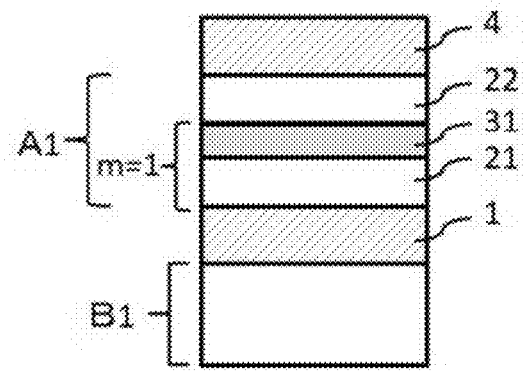
Fig. 3
Fig. 3(a)　　　　　　　　　　　　　　Fig. 3(b)
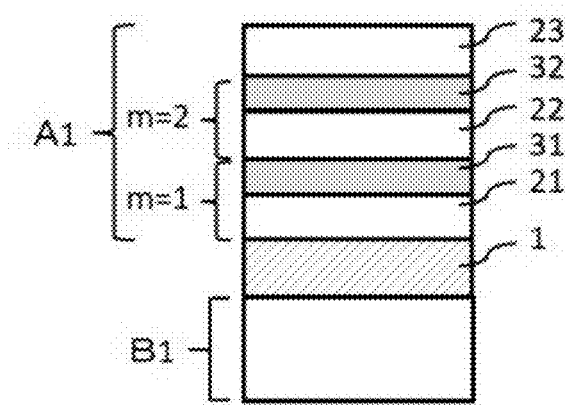

Fig. 11
Fig. 11(a)
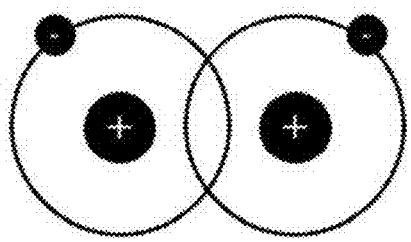
Fig. 11(b)
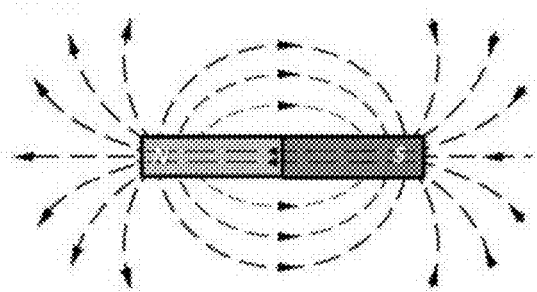
Fig. 12
Fig. 12(a)
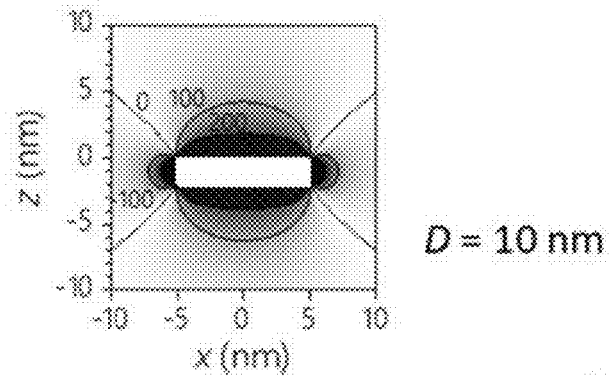
$D = 10$ nm
Fig. 12(b)
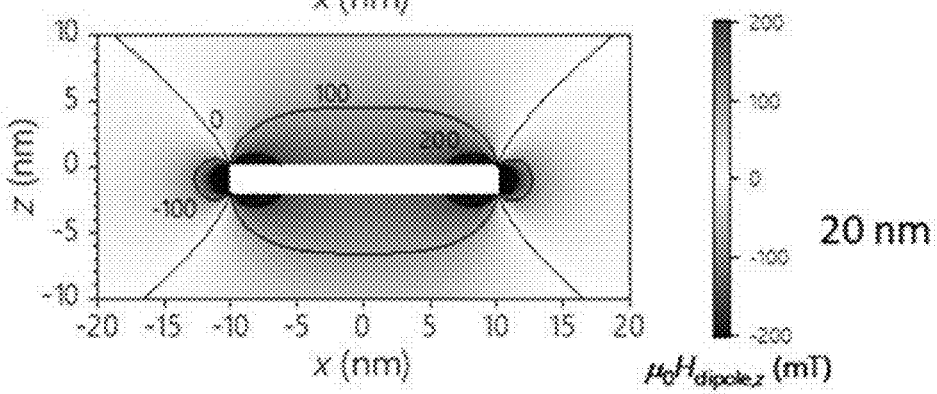
20 nm
$\mu_0 H_{dipole,z}$ (mT)
Fig. 12(c)
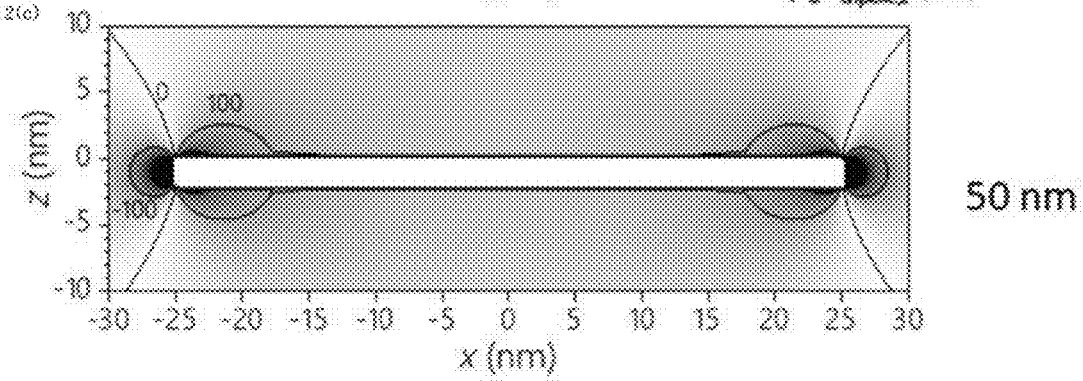
50 nm

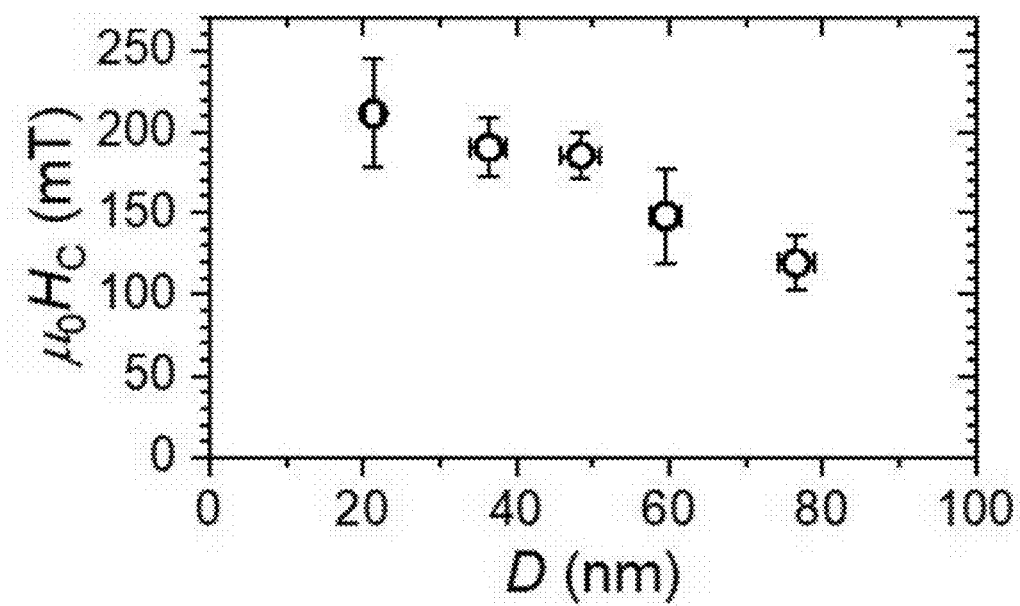
Fig. 15 MAGNETIC LAYER n = 4
(THREE NON-MAGNETIC INSERTION LAYERS)

MAGNETORESISTIVE ELEMENT AND MAGNETIC MEMORY

CROSS-REFERENCE TO RELATED APPLICATIONS

This application is a U.S. National Stage entry of PCT Application No. PCT/JP2019/004299 filed Feb. 6, 2016, which claims priority to Japanese Patent Application No. 2018-069879 filed Mar. 30, 2018, the contents of which are incorporated herein by reference.

TECHNICAL FIELD

The present invention relates to a magnetoresistance effect element, and a magnetic memory including the magnetoresistance effect element. More particularly, the present invention relates to a spin transfer torque magnetization reversal element,

BACKGROUND ART

A MRAM (Magnetic Random Access Memory: magnetic memory) is a nonvolatile memory using MTJ (Magnetic Tunnel Junction).

The MRAM not consuming electric power when on standby and exhibiting high-speed performance and having high writing resistance and moreover capable of being miniaturized in terms of memory size receives attention as a next-generation logic integrated circuit.

A magnetoresistance effect element for use as a MRAM basically has a structure in which a non-magnetic layer serving as a barrier layer is sandwiched between a recording layer and a reference layer. Bit information recorded on the magnetic layer (recording layer) of a MRAM is read out through the barrier layer using the TMR (Tunnel Magnetoresistance) effect.

Further, methods of writing to a magnetic layer (recording layer) include a method that uses a magnetic field and a method that uses a current. The MRAM that uses the latter writing method is, for example, of a 2-terminal type in which bit information is written to a magnetic layer (recording layer) using spin-transfer-torque (STT) induced magnetization reversal, or the like, and of a 3-terminal type in which bit information is written to a magnetic layer (recording layer) using spin-orbit-torque (SOT) induced magnetization reversal, or the like.

Incidentally, characteristics that make applications important in the MRAM, i.e., a magnetoresistance effect element, are (i) large thermal stability index $\Delta$, (ii) small writing current $I_C$, (iii) large tunnel magnetoresistance ratio (TMR ratio) of the magnetoresistance effect element, and (iv) small element size. The (i) is the characteristic required for the nonvolatility of a magnetic memory, the (ii) required for cell size reduction by reducing the size of a cell transistor, and reducing power consumption, the (iii) required for coping with high speed readout, and the (iv) required for cell area reduction thereby implementing a larger capacity.

Of the characteristics, the stability against thermal disturbance, namely, (i) thermal stability index $\Delta$ of the recording layer is expressed by the following equation.

$$\Delta = \frac{E}{k_B T} = \frac{K_{eff} t S}{k_B T} = \left(K_1 + K_b t - \frac{M_s^2}{2\mu_o} t\right) \frac{S}{k_B T} \quad \text{[Math. 1]}$$

In the equation of Math. 1, E represents energy barrier, $k_B$ represents Boltzmann constant, T represents absolute temperature, $K_{eff}$ represents effective magnetic anisotropy energy density, t represents film thickness, S represents area of a recording layer, $K_i$ represents interfacial magnetic anisotropy energy density, $K_b$ represents bulk (crystal) magnetic anisotropy energy density, $M_s$ represents saturation magnetization, and $\mu_S$ represents vacuum magnetic permeability.

Currently, the magnetoresistance effect element is required to exhibit, as ability thereof, nonvolatility for 10 years. In terms of the thermal stability index $\Delta$, at least 60 or more thereof is required.

Incidentally, for the effective magnetic anisotropy energy density $K_{eff}$ in the equation of Math. 1, when $K_{eff}>0$, an easily-magnetized axis in a perpendicular direction can be obtained, while, when $K_{eff}<0$, an easily-magnetized axis in an in-plane direction is given, and the easily-magnetized axis in a perpendicular direction cannot be obtained.

The present inventors lave conducted various extensive studies in order to improve the thermal stability index $\Delta$ of the magnetoresistance effect element.

NPL 1 discloses as follows: by applying a thinned CoFeB/MgO laminated layer structure to a perpendicular magnetic anisotropy magnetoresistance effect element, a magnetoresistance effect element having a thermal stability index $\Delta$ of about 40 at a recording layer with a diameter of 40 nm is obtained. With such a magnetoresistance effect element, the film thickness t is reduced, so that the contribution of the term (third term) of the diamagnetic field in the equation of Math. 1 is reduced, thereby implementing the easily-magnetized axis in a perpendicular direction, and simultaneously enhancing the thermal stability index $\Delta$.

NPL 2 discloses as follows: a MgO/CoFeB/Ta/CoFeB/MgO laminated layer structure having a double CoFeB/MgO interface is applied to u perpendicular magnetic anisotropy magnetoresistance effect element. As a result, a thermal stability index $\Delta$ that is 1.9 times mote than that in a case of one CoFeB/MgO interface can be obtained. With such a magnetoresistance effect element, the area S of the interface of the recording layer is doubled, thereby enhancing the contribution of the first term in the equation of Math. 1, and improving the thermal stability index $\Delta$.

Other than these, PTL 1 discloses a storage element capable of reducing a writing current amount even when a saturation magnetization amount of the recording layer is not reduced, and also capable of ensuring the thermal stability of the recording layer (PTL 1 paragraph 0023, abstract, and the like). In the storage element, an insulating layer in contact with the recording layer, and another layer in contact with the opposite side of the recording layer to the insulating layer each have at least an interface that is in contact with the recording layer and that is formed of an oxide film. Further, the recording layer includes one or both of a non-magnetic metal and an oxide in addition to the Co—Fe—B magnetic layer (PTL 1 paragraph 0020, and the like). Moreover, it is disclosed that, for example, in a case where Co—Fe—B of the recording layer includes MgO of an oxide and when a film thickness of MgO is 0.1 nm, 0.2 nm, or 0.3 nm, a higher thermal stability index $\Delta$ than that of Comparative Example not including an oxide or the like is obtained (PTL 1 paragraph 0125, and the like). On the other hand, when the film thickness of MgO is 0.4 nm, the coercivity roughly proportional to the thermal stability index becomes zero (PTL 1 paragraph 0125, and the like).

CITATION LIST

Non Patent Literature

[NPL 1] S. Ikeda, et. al., "A perpendicular-anisotropy CoFeB—MgO magnetic tunnel junction", Nature Materials, 9, 721-724, (2010)
[NPL 2] H. Sato, et. al., "Perpendicular-anisotropy CoFeB—MgO magnetic tunnel junctions with a MgO/CoFeB/Ta/CoFeB/MgO recording structure", Appl. Phys. Lett., 101, 022414 (2012)
[NPL 3] H. Sato, et. al., "Properties of magnetic tunnel junctions with a MgO/CoFeB/Ta/CoFeB/MgO recording structure down to junction diameter of 11 nm", Appl. Phys. Lett., 105, 062403 (2014)

PATENT LITERATURE

[PTL 1] Japanese Patent Application Publication No. 2012-64625

SUMMARY OF INVENTION

Technical Problem

However, with the magnetoresistance effect element disclosed in the citation literatures, such as the NPL 1, NPL 2, and PTL 1, or even a combination thereof, the thermal stability index $\Delta$ rapidly decreases as the element size becomes smaller than around 30 nm (NPL 3).

Namely, according to the related art, when an element size is equal to or larger than a certain size, the thermal stability index $\Delta$ is successfully increased. However, in the region with a small element size, the thermal stability index $\Delta$ is reduced. Accordingly, undesirably, when an element size is smaller than that required for high integration, a magnetic memory having high nonvolatility cannot be provided.

In view of the foregoing circumstances, the present invention has been completed by developing a configuration of a magnetoresistance effect element capable of stable record holding at higher temperatures and having a higher thermal stability even in the region with a small element size for the next generation, for which a magnetoresistance effect element having a finer size is required.

Solution to Problem

In order to solve the problem, a magnetoresistance effect element of the present invention includes: a reference layer (B1); a first non-magnetic layer (1) disposed adjacent to the reference layer (B1); a first magnetic layer (21) disposed adjacent to the first non-magnetic layer (1) on an opposite side thereof to the reference layer (B1); a first non-magnetic insertion layer (31) disposed adjacent to the first magnetic layer (21) on an opposite side thereof to the first non-magnetic layer (1); and a second magnetic layer (22) disposed adjacent to the first non-magnetic insertion layer (31) on an opposite side thereof to the first magnetic layer (21). The first non-magnetic layer (1) includes oxygen, the first non-magnetic insertion layer (31) is configured of a material including oxygen, and has u film thickness of 0.5 nm or more, the first magnetic layer (21), the first non-magnetic insertion layer (31), and the second magnetic layer (22) configure a recording layer (A1), and the recording layer (A1) has an element size of 50 nm or less.

It is desirable that the recording layer (A1) has a structure in which n (n≥2) magnetic layers and n−1 non-magnetic insertion layers are laminated alternately to be adjacent to one another, and a first magnetic layer (21) is disposed adjacent to the first non-magnetic layer (1).

It is preferable that each film thickness of the first turn-magnetic insertion layers is 0.6 nm or more and 1.5 nm or less.

Further, a magnetoresistance effect element of the present invention includes: a reference layer (B1); a first non magnetic layer (1) disposed adjacent to the reference layer (B1); and a recording layer (A1) disposed adjacent to the first non-magnetic layer (1) on an opposite side thereof to the reference layer (B1). The recording layer (A1) has a structure in which n (n≥2) magnetic layers and n−1 non-magnetic insertion layers are laminated alternately to be adjacent to one another, and a first magnetic layer (21) is disposed adjacent to the first non-magnetic layer (1). The recording layer (A1) has an element size of 50 nm or less, and a magnetostatic coupling is established between an m-th (1≤m≤n−1) magnetic layer and an m+1-th magnetic layer each adjacent to the m-th non-magnetic insertion layer due to a magnetostatic interaction becoming dominant.

It is desirable that a film thickness of each of the non-magnetic insertion layers is 0.6 nm or more and 1.5 nm or less.

It is also acceptable that a material of the non-magnetic insertion layer is selected from MgO, Al—O, Ta—O, W—O, or Hf—O.

It is desirable that a film thickness of each of the magnetic layers is 0.5 nm or more and 2.5 nm or less.

It is also acceptable that the material of the magnetic layer includes at least Fe or Co.

It is also acceptable that each of the magnetic layers includes a non-magnetic sub-insertion layer in the magnetic, layer.

The magnetoresistance effect element may further include a second non-magnetic layer (4) on an opposite side of the recording layer (A1) to the first non-magnetic layer (1). The second non-magnetic layer (4) may be configured of a material including oxygen.

Further, a magnetic memory of the present invention includes the magnetoresistance effect element.

Advantageous Effects of Invention

The present invention can provide a magnetoresistance effect element and a magnetic memory having a high thermal stability index $\Delta$ in the region with a small element size of the magnetoresistance effect element. Specifically, there are provided a magnetoresistance effect element and a magnetic memory with the magnetic layer having an easily-magnetized axis in a perpendicular direction, in which the area of the interface causing interfacial magnetic anisotropy has been increased by inserting one or a plurality of non-magnetic insertion layers to the magnetic layer of the recording layer, and the element size has been reduced.

Here, it is necessary to increase to a certain extent the thickness of the non-magnetic layer that is inserted in order to cause interfacial magnetic anisotropy in a direction perpendicular to a film surface. However, it was considered, even before a stage of studying the thermal stability, that in the first place, with this configuration, the magnetic layers adjacent to the non-magnetic layer become unable to be magnetically coupled with each other. Actually, it has been shown that, with an element size of more than generally 50 nm conventionally often studied, the magnetic layers of this configuration are not sufficiently magnetically coupled with each other. However, in accordance with the present invention, it has been newly found as follows. When the element size is reduced, even if one or a plurality of non-magnetic layers having a thickness causing interfacial magnetic anisotropy are inserted, the magnetic layers are magnetically coupled with each other. Thus, the thermal stability index Δ can be enhanced with an increase in area of the interface (S in the equation of Math. 1). Namely, the present invention cat) provide a magnetoresistance effect element and a magnetic memory, capable of sufficiently complementing the thermal stability-index Δ reducing in the region with a small element size, or capable of further enhancing the thermal stability index Δ.

Incidentally, the element size of the magnetoresistance effect element in this application represents the short side or the minor axis of the element shape. The element size represents the diameter when the element shape is a circle, and the short side or the minor axis for an ellipse.

BRIEF DESCRIPTION OF DRAWINGS

FIG. 1(a) and FIG. 1(b) show a longitudinal section view of one example of a configuration of a magnetoresistance effect element of the present invention.

FIG. 2(a) and FIG. 2(b) show a longitudinal sect ion view of another example of a configuration of the magnetoresistance effect element of the present invention.

FIG. 3(a) and FIG. 3(b) show a longitudinal section view of a still other example of a configuration of the magnetoresistance effect element of the present invention.

FIG. 11(a) is a view for illustrating the exchange coupling action (exchange coupling) between the magnetic layers, and FIG. 11 (b) is a view for illustrating the magnetostatic interaction (magnetostatic coupling) between the magnetic layers.

FIG. 12 is a view for illustrating the magnetic field around a nanomagnet. FIG. 12(a) shows the case where the diameter is 10 nm, FIG. 12(b) shows the case where the diameter is 20 run, and FIG. 12(c) shows the case where the diameter is 50 nm.

FIG. 15 is a graph showing the relationship between the element size and the coercivity.

DESCRIPTION OF EMBODIMENTS

Figure 4:
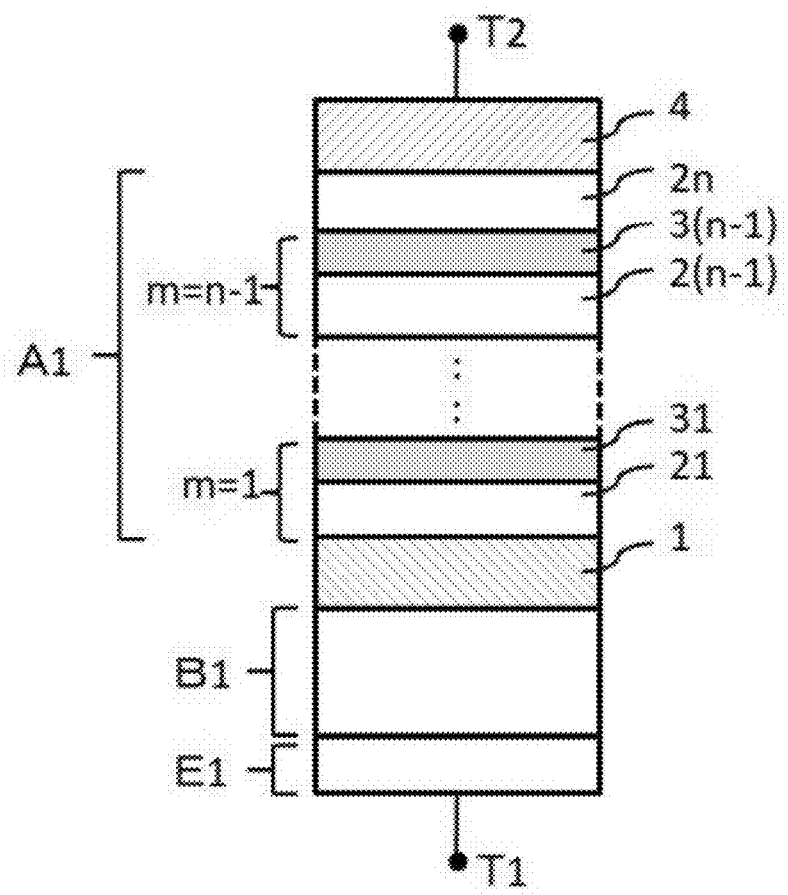
FIG. 4 shows a longitudinal section view of a still farther example of a configuration of the magnetoresistance effect element of the present invention.

Below, referring to the accompanying drawings, a magnetoresistance effect element and a magnetic memory of the present invention will be described in detail.

Incidentally, each drawing is merely an example, and is given a reference numeral and sign, but does not restrict the present invention at all.

Embodiment 1

FIG. 1(a) shows a basic configuration of Embodiment 1 of the present invention. The basic configuration of the magnetoresistance effect element includes reference layer (B1)/first non-magnetic layer (1)/first magnetic layer (21)/first non-magnetic insertion layer (31)/second magnetic layer (22) arranged sequentially and adjacent to one another. The first magnetic layer (21)/first non-magnetic insertion layer (31)/second magnetic layer (22) configure a recording layer (A1).

At least the interface of the first non-magnetic layer (1)/first magnetic layer (21) has interfacial magnetic anisotropy in a perpendicular direction. Further, between the first magnetic layer (21) and the second magnetic layer (22), a magnetostatic interaction described later becomes dominant, resulting in a ferromagnetic coupling therebetween via magnetostatic coupling.

FIG. 1(b) shows a configuration example in which a second non-magnetic layer (4) is further provided adjacent to the second magnetic layer (22) of Embodiment 1. The materials and the film thickness are desirably adjusted so that the interface of the second magnetic layer (22)/second non-magnetic layer (4) also has perpendicular magnetic anisotropy.

In FIG. 1(b), the reference layer (B1) is adjacent to the first non-magnetic layer (1) side, and hence the first non-magnetic layer (1) serves as a barrier layer (tunnel junction layer including an insulating layer). Although not shown, when a reference layer is further adjacent to the second non-magnetic layer (4) side, the second non-magnetic layer (4) also serves as a barrier layer.

The reference layer (B1) is a magnetic layer with the magnetization direction fixed. Examples thereof may include [Co/Pt]/Ru/[Co/Pt]/Ta/CoFeB. [Co/Pt] denotes an alternate laminated layer of Co/Pt. [Co/Pd], [Co/Ni], or the like can also be used. In place of Ru, Ir or the like is also acceptable, and Ta may be W, Mo, Hf, or the like. Further, CoFeB may be FeB, or the like.

For the first non-magnetic layer (1) and the second non-magnetic layer (4), a material including O (oxygen) is used. When the first non-magnetic layer (1), and the second non-magnetic layer (4) each become a barrier layer (tunnel junction layer including an insulating layer) of the magnetoresistance effect element, an insulator including oxygen such as $MgO$, $Al_2O_3$, $SiO_3$, $TiO$, or $Hf_2O$ is used so that the magnetic resistance change rate is largely expressed according to the combination of the materials of the two end faces to be joined. MgO is preferably used.

When the first non-magnetic layer (1) and the second non-magnetic layer (4) each serve as a barrier layer of the magnetoresistance effect element, the film thickness thereof is preferably 0.5 ran or more, and more preferably 0.8 nm or more in order to increase the TMR ratio. Further, the film thickness is preferably 2.0 nm or less, and more preferably 1.5 nm or less in order to cause magnetization reversal with a small writing current $I_C$. Accordingly, the film thickness is adjusted within the range of 0.5 to 2.0 nm, and more preferably within the range of 0.8 to 1.5 nm.

On the other hand, when the second non-magnetic layer (4) does not become a barrier layer of the magnetoresistance effect element, and when provided as a cap layer, an insulator including oxygen such as MgO, $Al_2O_3$, $SiO_2$, TiO, $Hf_2O$, Ta—O, or W—O is used. Preferably, MgO is used.

The first magnetic layer (21) and the second magnetic layer (22) include at least any of Co or Fe, and may further include a 3d ferromagnetic transition metal such as Ni.

Further, the first magnetic layer (21) and the second magnetic layer (22) may further include a non-magnetic element such as W, Ta, Hf, Zr, Nb, Mo, Ti, V, Cr, Si, Al, B, Pd, or Pt. Out of these, B or V is also preferable because of the ease of handling. The non-magnetic elements can reduce the saturation magnetization ($M_s$) of the magnetic layer.

Specific examples thereof may include but are not limited to Co, CoFe, CoB, Fe, FeB, and CoFeB. Any material is acceptable so long as it makes a magnetostatic interaction described later dominant, and establishes a ferromagnetic coupling between the first magnetic layer (21) and the second magnetic layer (22), and has interfacial magnetic anisotropy in a direction perpendicular to a film surface.

Each film thickness of the first magnetic layer (21) and the second magnetic layer (22) preferably (hits within the range of 0.3 nm to 3.0 nm, and more preferably falls within the range of 0.5 nm to 2.5 nm. This is due to the following. When the film thickness becomes smaller, stable ferromagnetism cannot be obtained. On the other hand, when the film thickness becomes larger, and when MgO or the like is used for the first magnetic layer (1) and the second non magnetic layer (4), easily-magnetized axis in an in-plane direction is caused.

The first non-magnetic insertion layer (31) is configured of a material including at least oxygen, and includes a non-magnetic element such as W, Ta, Hf, Zr, Nb, Mo, Ti, V, Cr, Si, Al, B, Pd, or Pt. Out of these, for the first non-magnetic insertion layer (31), a material causes larger interfacial magnetic anisotropy at both the interfaces with the adjacent first magnetic layer (21) and second magnetic layer (22) is preferable. MgO, Al—O, Ta—O, W—O, Hf—O, or the like is more preferable.

The film thickness of the first non-magnetic insertion layer (31) is adjusted to the thickness causing interfacial magnetic anisotropy in a direction perpendicular to a film surface at the interface with the adjacent magnetic layer, and to such a thinness as to be capable of providing a sufficient TMR ratio. The former requirement determines the lower limit, and the film thickness is about 0.5 nm. Further, with a film thickness equal to or larger than this film thickness, the adjacent ferromagnetic layers are ferromagnetically coupled with each other by a magnetostatic interaction. Whereas, the latter requirement determines the upper limit, and the film thickness is about 2.0 nm. Namely, the film thickness of the first non-magnetic insertion layer (31) is preferably within the range of 0.5 nm to 2.0 nm, and more preferably within the range of 0.6 nm to 1.5 nm. The film thickness is further preferably 0.7 nm to 1.1 nm.

The element size of the recording layer (A1) is 50 nm or less in terms of the minor axis. As described above, the element size of the magnetoresistance effect element in the present application is the short side or the minor axis of the element shape. The element size denotes a diameter when the element shape is a circle; a minor axis for an ellipse; and the short side for a rectangle.

For the magnetic layers configuring the recording layer (A1), when the magnetization direction is reversed as a magnetoresistance effect element, a magnetostatic interaction becomes dominant, thereby causing magnetostatic coupling therebetween. For this reason, the magnetic layers are substantially integrated to undergo magnetization reversal.

Respective layers are desirably laminated by sputtering. Each film thickness is adjusted by the sputtering conditions such as the sputtering time.

Below, the evaluation and study supporting the configuration of Embodiment 1 will be described.

<Comparison Between Conventional Double Interfacial MTJ and Magnetostatic Coupling MTJ of Present Invention>

Figure 10:
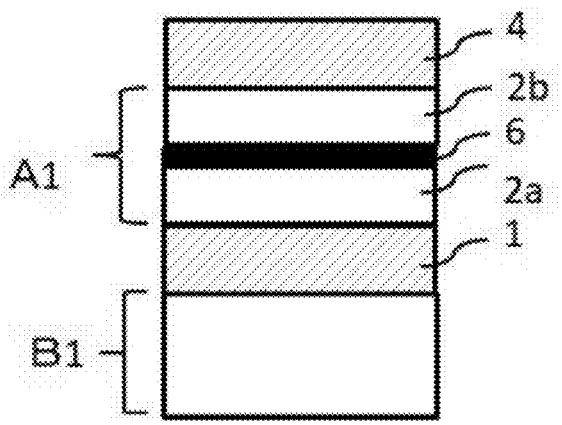
FIG. 10 shows a longitudinal section view of a configuration of a conventional magnetoresistance effect element.

FIG. 10 shows a configuration of a conventional double interfacial MTJ (magnetic tunnel junction). Reference layer (B1)/first non-magnetic layer (1)/first magnetic layer (2a)/non-magnetic sub-insertion layer (6)/second magnetic layer (2b)/second non-magnetic layer (4) are sequentially arranged adjacent to one another. The first magnetic layer (2a)/non-magnetic insertion layer (6)/second magnetic layer (2b) configure the recording layer (A1).

The first non-magnetic layer (1) and the second non-magnetic layer (4) include a non-magnetic element including oxygen. MgO or the like is preferably used.

The first magnetic layer (2a) and the second magnetic layer (2b) each include at least any of Co or Fe. Specific examples thereof may include Co, CoFe, CoB, Fe, FeB, and CoFeB.

The non-magnetic sub-insertion layer (6) includes a non-magnetic element such as W, Ta, Hf, Zr, Nb, Mo, Ti, V, Cr, Si, Al, B, Pd, or Pt. As more preferable elements, W, Ta, and the like are exemplified. The non-magnetic sub-insertion layer (6) has a role of promoting absorption and crystallization of B when B is present in the adjacent magnetic layer, and is required to ferromagnetically couple the adjacent first magnetic layer (2a) and second magnetic layer (2b) via exchange coupling described later. For this reason, the film thickness of the non-magnetic sub-insertion layer (6) is adjusted to a sufficiently small thickness, for example, about 0.2 nm to 0.7 nm.

With the layer configuration described up to this point, perpendicular magnetic anisotropy is possessed at the two interfaces (double interfaces) of the interface between the first non-magnetic layer (1) and the first magnetic layer (2a), and the interface between the second magnetic layer (2b) and the second non magnetic layer (4). As a result, the area S of the interface of the recording layer is doubled to enhance the contribution of the first term in the equation of Math. 1, thereby improving the thermal stability index Δ.

On the other hand, the example of the magnetostatic coupling MTJ of the present invention is shown in FIG. 1(a) or FIG. 1(b). As described previously, other than at the interface of first non magnetic layer (1)/first magnetic layer (21), at the interface of first magnetic layer (21)/first non-magnetic insertion layer (31), the interface of first non-magnetic insertion layer (31)/second magnetic layer (22), and the interface of second magnetic layer (22)/second non-magnetic layer (4) when the second non-magnetic layer (4) is included, interfacial magnetic anisotropy in a direction perpendicular to the film surface is possessed.

Further, when the element size of the recording layer (A1) is 50 nm or less, a ferromagnetic coupling is established between the first magnetic layer (21) and the second magnetic layer (22) via magnetostatic coupling.

From the layer configuration described up to this point, at three or four interfaces, interfacial magnetic anisotropy in a direction perpendicular to a film surface is possessed. As a result, the area S of the interface of the recording layer is trebled or quadrupled, thereby to enhance the contribution of the first term in the equation of Math. 1, which can improve the thermal stability index Δ.

Herein, exchange coupling will be described.

As shown in an image in FIG. 11(a), an exchange coupling is based on the quantum-mechanical interaction acting when two atoms approach each other to the extent that the electron orbits of the two atoms overlap. The exchange coupling is caused such that when two atoms approach each other, an energy difference is caused between the case where the spins of two electrons are in parallel with each other and the case where the spins are in antiparallel with each other. For this reason, the electrons on one atom also come and go to the electron orbit of the other atom so as to become stable in terms of energy. Further, the electron spin coupling caused via free electrons or the like is also a kind of exchange coupling. In other words, the exchange coupling based on the exchange interaction is caused only at a short range to the extent that the orbits overlap each other.

Then, a magnetostatic coupling will be described.

As shown in an image in FIG. 11(b), a magnetostatic coupling is based on the classical electromagnetic interaction acting by the line of magnetic force discharged from each magnet on two magnets placed closed to each other. The two magnets are coupled ferromagnetically or antiferromagnetically according to the mutual locations. Accordingly, the magnetostatic coupling based on the magnetostatic interaction acts even at a relatively long range.

Further, the interval distribution of the magnetostatic energy is determined by the shape and the size of the magnetic substance.

FIG. 12 shows the results of the study on the magnetic held (magnetostatic field) formed in the periphery when the element size (diameter of the circle) is (a) 10 nm, (b) 20 nm, and (c) 50 nm for a nanomagnet with a film thickness of 2 nm, and magnetized in a direction perpendicular to a film surface with a saturation magnetization of 1.5 T. The X axis indicates the diameter direction of the element, and the Z axis indicates the film thickness direction of the element, and the numerical value inside the drawing is the value of the magnetic field (mT). A positive value of the magnetic field indicates that the magnetic field points upward, and a negative value indicates that the magnetic field points downward. Further, the region with a magnetic field of 200 mT or more or −200 mT or less is surrounded by a mesh, and the region with a magnetic field of 100 mT or more or −100 mT or less is surrounded by a solid line for expression.

The magnetic field distribution of each X-Z cross section of FIG. 12(a), FIG. (b), and FIG. (c) indicates as follows: an upward magnetic field spreads in an arc from the region from the X axis end to the −X axis end of the X-Y plane of the nanomagnet (i.e., the inside of the plane of the nanomagnet) in the Z axial direction and the −Z axial direction; and in other spaces, a downward magnetic field spreads.

It is indicated as follows. As in FIG. 12(a), when the diameter is small, a large magnetic field is generated over a relatively wide region in the periphery of the nanomagnet. It can be said that the large magnetic, field causes a large magnetostatic coupling to act on the overlying and underlying magnetic layers.

On the other hand, as in FIG. 12(b) and FIG. 12(c), an increase in diameter results in a relative decrease in the region where a large magnetic field is generated at the center of the nanomagnet. For this reason, it can be said that the magnetostatic coupling acting on the overlying and underlying magnetic layers is weakened as compared with the case of FIG. 12(a).

Figure 13:
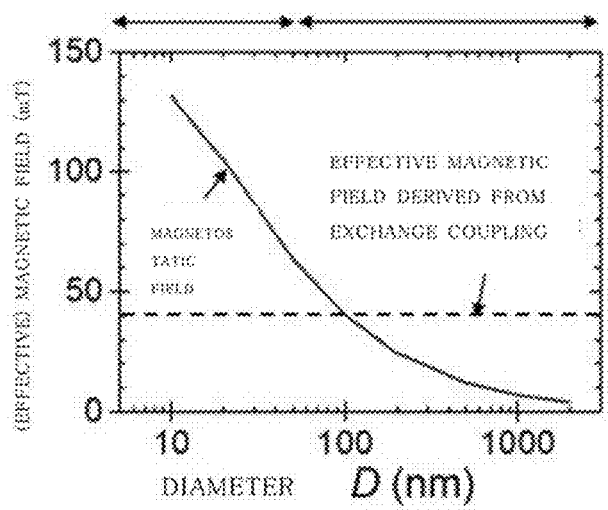
FIG. 13 is a graph showing the element size dependency of the magnetostatic field.

FIG. 13 shows the results of the study on the relationship between the magnetostatic field and the element size. For comparison, the effective magnetic field derived from the exchange coupling is also shown together.

As also studied in FIG. 12, a decrease in element size results in an increase in magnetostatic field, and an increase in element size results in a decrease in magnetostatic field. On the other hand, although the effective magnetic field derived from the exchange coupling strongly depends upon the material and the film thickness, the effective magnetic field is generated by the atomic level approach as shown in FIG. 11(a), and does not depend upon the element size.

From the characteristics of the magnetostatic field and the effective magnetic field derived from the exchange coupling described up to this point, it is indicated that with an element size of the magnetoresistance effect element of roughly 50 nm or less, a magnetostatic coupling becomes dominant.

Embodiment 2

FIG. 2(a) shows a configuration of Embodiment 2 of the present invention. The configuration of the magnetoresistance effect element includes reference layer (B1)/first non-magnetic layer (1)/first magnetic layer (21)/first non-magnetic insertion layer (31)/second magnetic layer (22)/second non magnetic insertion layer (32)/third magnetic layer (23) sequentially arranged adjacent to one another. The first magnetic layer (21)/first non-magnetic insertion layer (31)/ second magnetic layer (22)/second non-magnetic insertion layer (32)/third magnetic layer (23) configure the recording layer (A1).

At least, the interface of the first non-magnetic layer (1)/first magnetic layer (21) has interfacial magnetic anisotropy in a perpendicular direction. Further, a magnetostatic interaction becomes dominant between the first magnetic layer (21) and the second magnetic layer (22), and between the second magnetic layer (22) and the third magnetic layer (23), and a ferromagnetic coupling is established via magnetostatic coupling therebetween.

FIG. 2(b) show's a configuration example in which a second non-magnetic layer (4) is further provided adjacent, to the third magnetic layer (23) of the Embodiment 2. The material and the film thickness are desirably adjusted so that the interlace of the third magnetic layer (23)/second non-magnetic layer (4) also has perpendicular magnetic anisotropy.

The details of Embodiment 2 are the same as those of Embodiment 1 except for the following description.

The third magnetic layer (23) includes, at least any of Co or Fe, and may further include a 3d ferromagnetic transition metal such as Ni.

Further, the third magnetic layer (23) may further include a non-magnetic element such as W, Ta, Hf, Zr, Nb, Mo, Ti, V, Cr, Si, Al, B, Fd, or Pt. Out of these, B or V is preferable from the viewpoint of ease of handling. The non-magnetic elements can reduce the saturation magnetization ($M_s$) of the magnetic layer.

Specific examples thereof may include but are not limited to Co, CoFe, CoB, Fe, FeB, and CoFeB. Any material is acceptable so long as it causes the magnetostatic interaction to become dominant, and establishes a ferromagnetic coupling between the second magnetic layer (22) and the third magnetic layer (23) via magnetostatic coupling, and has interfacial magnetic anisotropy in u direction perpendicular to a film surface.

The film thickness of the third magnetic layer (23) preferably falls within the range of 0.3 nm to 3.0 nm, and more preferably falls within the range of 0.5 nm to 2.5 nm. This is due to the following. When the film thickness becomes smaller, stable ferromagnetism cannot be obtained. On the other hand, when the film thickness becomes larger, easily-magnetized axis in an in-plane direction is caused when MgO or the like is used for the first nonmagnetic layer (1) and the second non-magnetic layer (4).

The second non-magnetic insertion layer (32) is configured of a material including at least oxygen, and includes a non-magnetic element such as W, Ta, Hf, Zr, Nb, Mo, Ti, V, Cr, Si, Al, B, Pd, or Pt. Out of these, for the second non-magnetic insertion layer (32), a material causing larger interfacial magnetic anisotropy at both the interlaces with the adjacent second magnetic layer (22) and third magnetic layer (23) is preferable. MgO, Al—O, Ta—O, W—O, Hf—O. or the like is more preferable.

The film thickness of the second non-magnetic insertion layer (32) is adjusted to the thickness causing interfacial magnetic anisotropy in a direction perpendicular to a film surface at the interface with the adjacent magnetic layer, and to such a thinness as to be capable of providing a sufficient TMR ratio. The former requirement determines the lower limit, and the film thickness is about 0.5 nm. Further, with a film thickness equal to or larger than this film thickness, the adjacent ferromagnetic layers are ferromagnetically coupled with each other by a magnetostatic interaction. Whereas, the latter requirement determines the upper limit, and the film thickness is about 2.0 nm. Namely, the film thickness of the second non-magnetic insertion layer (32) is preferably within the range of 0.5 nm to 2.0 nm, and more preferably within the range of 0.6 nm to 1.5 nm. The film thickness is further preferably 0.7 nm to 1.1 nm.

Specific examples of the laminated layer structure of the recording layer in Embodiment 2 may include FeB (2.0 nm)/MgO (0.9 nm)/FeB (2.0 nm)/MgO (0.9 nm)/FeB (2.0 nm).

Embodiment 3

FIG. 3(a) shows a configuration of Embodiment 3 of the present invention, in the recording layer in Embodiment 1, the magnetoresistance effect element includes magnetic layers and non magnetic insertion layers laminated alternately and adjacent to each other n times and (n−1) times, respectively (n≥2). Namely, the reference layer (B1)/first non-magnetic layer (1)/first magnetic layer (21)/first non-magnetic insertion layer (31)/ . . . /(n−1)-th magnetic layer (2(n−1))/(n−1)-th non-magnetic insertion layer (3(n−1))/n-th magnetic layer (2n) are sequentially arranged adjacent to one another. The first magnetic layer (21)/first non-magnetic insertion layer (31)/ . . . / (n−1)-th magnetic layer (2(n−1))/(n−1)-th non-magnetic insertion layer (3(n−1))/n-th magnetic, layer (2n) configure the recording layer (A1).

At least the interface of the first non-magnetic layer (1)/first magnetic layer (21) has interfacial magnetic anisotropy in a perpendicular direction. Further, a magnetostatic interaction becomes dominant, and a ferromagnetic coupling is established via magnetostatic coupling between an m-th magnetic layer and a m+1-th magnetic layer adjacent to an m-th (1≤m≤n−1) non-magnetic insertion layer counted from the first non-magnetic layer (1) side.

FIG. 3(b) shows a configuration example in which a second non-magnetic layer (4) is further provided adjacent, to the n-th magnetic layer (2n) of the Embodiment 3. The material and the film thickness are desirably adjusted so that the interlace of the n-th magnetic layer (2n)/second non-magnetic layer (1) also has perpendicular magnetic anisotropy.

Incidentally, in Embodiment 3, n=2 results in Embodiment 1, and n=3 results in Embodiment 2.

The details of Embodiment 3 are the same us those of Embodiment 1 except for the following description.

The m-th (1≤m≤n) magnetic layer includes at least any of Co or Fe, and may further include a 3d ferromagnetic transition metal such as Ni.

Further, the m-th magnetic layer may further include a non-magnetic element such as W, Ta, Hf, Zr, Nb, Mo, Ti, V, Cr, Si, Al, B, Pd, or Pt. Out of these. B and V are also preferable from the viewpoint of the ease of handling. The non-magnetic element can reduce the saturation magnetization ($M_s$) of the magnetic layer.

Specific examples thereof may include but are not limited to Co, CoFe, CoB, Fe, FeB, and CoFeB. Any material is acceptable so long as it causes the magnetostatic interaction to become dominant, and establishes a ferromagnetic coupling between the m-th magnetic layer and the m+1-th magnetic layer via magnetostatic coupling, and has interfacial magnetic anisotropy in a direction perpendicular to a film surface.

The film thickness of the m-th magnetic layer preferably falls within the range of 0.3 nm to 3.0 nm, and more preferably falls within the range of 0.5 nm to 2.5 nm. This is due to the following. When the film thickness becomes smaller, stable ferromagnetism cannot be obtained. On the other hand, when the film thickness becomes larger, easily-magnetized axis in an in-plane direction is caused when MgO or the like is used for the first non-magnetic layer (1) and the second non-magnetic layer (4).

The m-th (1≤m≤n−1) non-magnetic insertion layer is configured of a material including at least oxygen, and includes a non-magnetic element such as W, Ta, Hf, Zr, Nb, Mo, Ti, V, Cr, Si, Al, B, Pd, or Pt. Out of these, for the m-th non magnetic insertion layer, a material causing larger interfacial magnetic anisotropy at both the interfaces with the adjacent m-th magnetic layer and m+1-th magnetic layer is preferable. MgO, Al—O, Ta— O, W—O, Hf—O, or the like is more preferable.

The film thickness of the m-th nonmagnetic insertion layer is adjusted to the thickness causing interfacial magnetic anisotropy in a direction perpendicular to a film surface at the interface with the adjacent magnetic layer, and to such a thinness as to be capable of providing a sufficient TMR ratio. The former requirement determines the lower limit, and the film thickness is about 0.5 nm. Further, with a film thickness equal to or larger than this film thickness, the adjacent ferromagnetic layers are ferromagnetically coupled with each other by a magnetostatic interaction. Whereas, the latter requirement determines the upper limit, and the film thickness is about 2.0 nm. Namely, each film thickness of the non-magnetic insertion layers is preferably within the range of 0.5 nm to 2.0 nm, and more preferably within the range of 0.6 nm to 1.5 nm. The film thickness is further preferably 0.7 nm to 1.1 nm.

Figure 14:
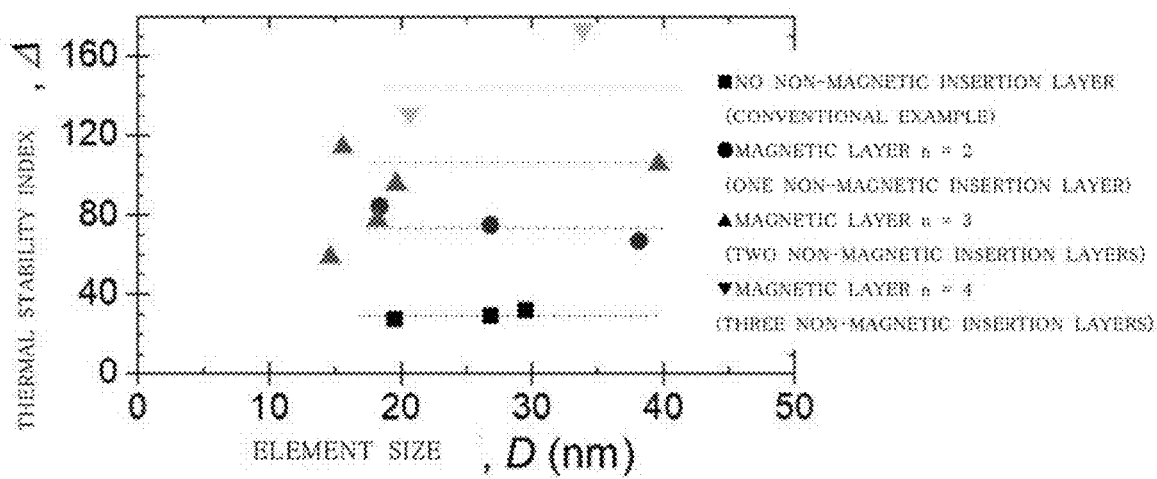
FIG. 14 is a graph showing the relationship between the element size and the laminated layer count, and the thermal stability index.

FIG. 14 shows the results of a study on how the thermal stability index Δ is increased by laminating the magnetic layers and the non-magnetic layers alternately and adjacent to one another in Embodiment 3.

An element of Embodiment 3 was manufactured so as to have an element size of 50 nm or less, and was measured for the thermal stability index Δ. This indicates us follows. In the region with an element size of 50 nm or less, as compared with the example of a conventional double interface not including a non-magnetic insertion layer, the thermal stability index Δ is approximately doubled when n=2; approximately trebled when n=3; and approximately quadrupled when n=4.

Incidentally, it is generally assumed that a magnetoresistance effect element has a large error in element manufacturing. Even in consideration of this point, it has been indicated that the thermal stability index Δ is substantially increased.

FIG. 15 shows the results of a study on the range of the proper element size of the recording layer of the magnetoresistance effect element in Embodiment 3.

The element (the one including four magnetic layers and three non-magnetic insertion layers laminated alternately) of Embodiment 3 was manufactured such that the element has an element size of about 100 nm or less, and was measured for the coercivity R of the index roughly proportional to the thermal stability index Δ. The plot denotes the average of the measured values of a large number of elements, and the error bar denotes the standard deviation thereof.

FIG. 15 indicates as follows. An element size equal to or smaller than 50 nm can provide a coercivity IT as very large as about 200 mT. Whereas, an element size of more than 50 nm reduces the coercivity IT. In other words, it is indicated as follows. When the element size exceeds 50 nm, magnetostatic coupling based on the magnetostatic interaction ceases to sufficiently act, resulting in the reduction of the coercivity R, namely, the thermal stability index Δ.

Embodiment 4

FIG. 4 shows a configuration of Embodiment 4 of the present invention. The configuration is of a two-terminal type for performing writing of information using spin transfer torque magnetization reversal, and includes base layer (E1)/reference layer (B1) f first non-magnetic layer (1)/recording layer (A1)/second non-magnetic layer (4) arranged sequentially adjacent to one another. The base layer (E1) is provided with a first terminal (T1), and the second non-magnetic layer (4) is provided with a second terminal (T2). The recording layer (A1) has the same configuration as that of Embodiment 3.

Embodiment 4 is the same as Embodiment 3 except for the following description.

The reference layer (B1) is a magnetic layer with the magnetization direction fixed. Examples thereof may include [Co/Pt]/Ru/[Co/Pt]/Ta/CoFeB. [Co/Pt] denotes an alternate laminated layer film of Co/Pt. [Co/Pd], [Co/Ni], or the like can be used. In place of Ru, Ir or the like is also acceptable. Ta may be W, Mo, Hf, or the like. Further, CoFeB may be FeB or the like.

The first non-magnetic layer (1) sandwiched between and adjacent to the recording layer (A1) and the reference layer (B1) becomes a barrier layer (tunnel junction layer including an insulating layer). For this reason, an insulator including oxygen such as MgO, $Al_2O_3$, $SiO_2$, TiO, or $Hf_2O$ is used so that the magnetic resistance change rate is largely expressed according to the combination of the materials of the two end laces to be joined. MgO is preferably used.

The film thickness of the first non-magnetic layer (1) serving as a barrier layer is preferably 0.5 nm or more, and more preferably 0.8 nm or more in order to increase the TMR ratio. Further, the film thickness is preferably 2.0 nm or less, and more preferably 1.5 nm in order to undergo magnetization reversal with a small write voltage $V_C$. Accordingly, the film thickness is adjusted to the range of 0.5 to 2.0 nm, and more preferably within the range of 0.8 to 1.5 nm.

Embodiment 5

Figure 5:
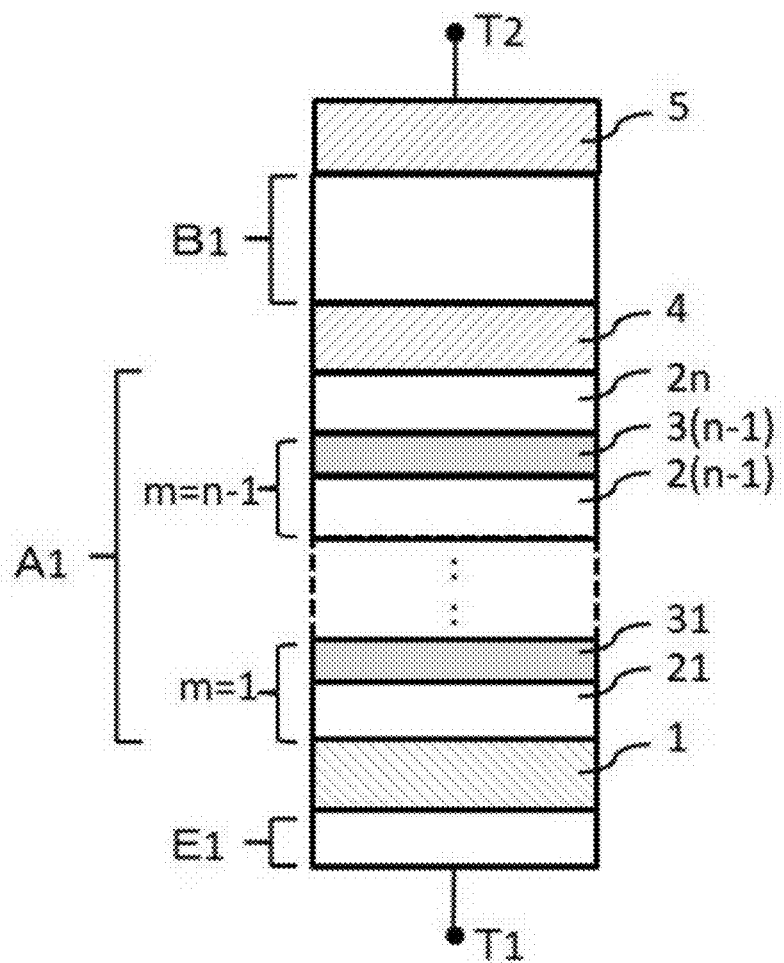
FIG. 5 shows a longitudinal section view of a furthermore example of a configuration of the magnetoresistance effect element of the present invention.

FIG. 5 shows a configuration of Embodiment 5 of the present invention. The configuration is of a two-terminal type for performing writing of information using spin transfer torque magnetization reversal, and includes base layer (E1)/first non-magnetic layer (1)/recording layer (A1)/second non-magnetic layer (4)/reference layer (B1)/third non-magnetic layer (5) arranged sequentially adjacent to one another. The base layer (E1) is provided with a first terminal (T1), and the third non-magnetic layer (5) is provided with a second terminal (T2). The recording layer (A1) has the same configuration as that of Embodiment 3.

The details of Embodiment 5 are the same us those of Embodiment 3 and Embodiment 4 except for the following description.

The second magnetic layer (4) sandwiched between and adjacent to the recording layer (A1) and the reference layer (B1) becomes a barrier layer (tunnel junction layer including an insulating layer). For this reason, an insulator including oxygen such as MgO, $Al_2O_3$, $SiO_2$, TiO, or $Hf_2O$ is used so that the magnetic resistance change rate is largely expressed according to the combination of the materials of the two end faces to be joined. MgO is preferably used.

The film thickness of the second non-magnetic layer (4) serving as a barrier layer is preferably 0.5 nm or more, and more preferably 0.8 nm or more in order to increase the TMR ratio. Further, the film thickness is preferably 2.0 nm or less, and more preferably 1.5 nm in order to undergo magnetization reversal with a small write voltage $V_C$. Accordingly, the film thickness is adjusted to the range of 0.5 to 2.0 nm, and more preferably within the range of 0.8 to 1.5 nm.

For the third non-magnetic layer (5), a metal such as Ta, W, or Ru is used as a cap layer.

Embodiment 6

Figure 6:
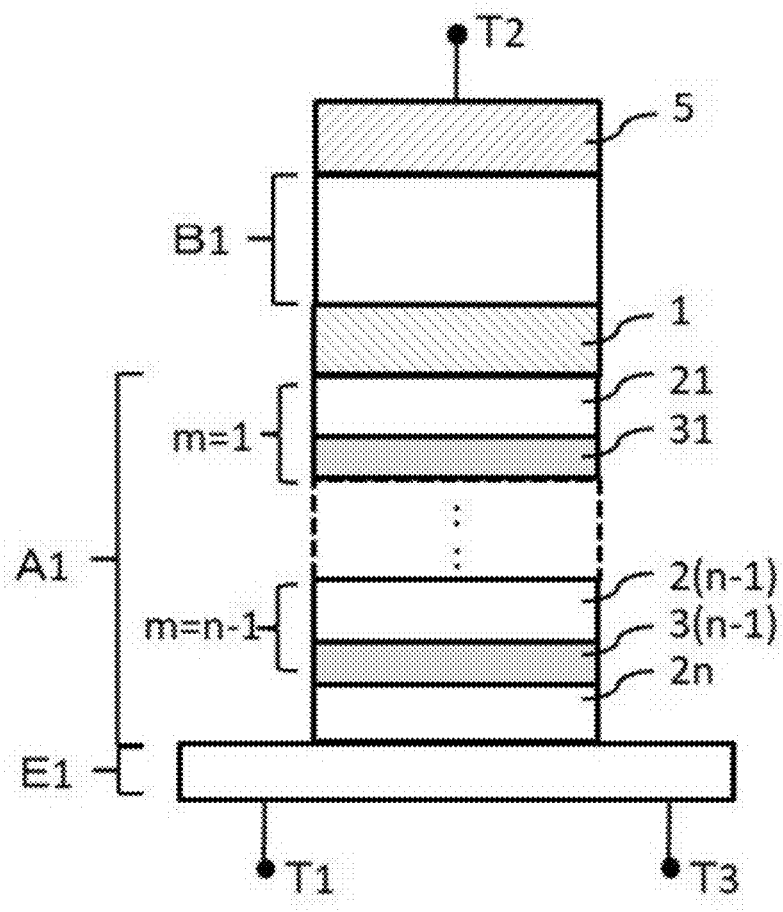
FIG. 6 shows a longitudinal section view of a still other example of a configuration of the magnetoresistance effect element of the present invention.

FIG. 6 shows a configuration of Embodiment 6 of the present invention. The configuration is of a three-terminal type for performing writing of information using spin transfer torque magnetization reversal, and includes base layer (E1)/recording layer (A1)/first non-magnetic layer (1)/reference layer (B1)/third non-magnetic layer (5) arranged sequentially adjacent to one another. The base layer (E1) is provided with a first terminal (T1) and a third terminal (T3), and the third non-magnetic layer (5) is provided with the second terminal (T2). The recording layer (A1) has the same configuration as that of the recording layer of Embodiment 3 (in the drawing, the configuration is vertically inverted).

The details of Embodiment 6 are the same as those of Embodiments 1 to 5 except tor the following description.

The base layer (E1) of Embodiment 6 may only be a material having characteristics just to generate a spin orbit torque enough to reverse the recording layer (A1) of magnetic tunnel junction as a channel layer, and desirably have especially a heavy metal. When a writing current $I_{write}$ is introduced to the base layer (E1), a spin orbit torque is generated. As a result, writing to the magnetoresistance effect element is performed. For this reason, the material is desirably configured of a heavy metal having a large spin/orbit interaction, for example, Ta, W, Hf, Re, Os, Ir, Pt, or Pd, or an alloy thereof. A material obtained by appropriately adding a transition metal to the heavy metal layer is also acceptable, or a material obtained by doping a conductive material or the like with a heavy metal is also acceptable. Further, for the purpose of improvement of the electric material characteristics, or other purposes, B, C, N, O, Al, Si, P, Ga, Go, or the like may be added. Further, Co—Ga or the like also becomes un option.

The shape of the base layer (E1) has no particular restriction so long as it is the shape allowing the writing current $I_{write}$ to pass therethrough, and efficiently causing magnetization reversal with respect to the recording layer (A1), and is desirably a planar shape extended in the direction of the writing current $I_{write}$.

The magnetoresistance effect element of a three terminal type may be in any direction of axis of easy magnetization of Z type, Y type, and X type.

Embodiment 7

Figure 7:
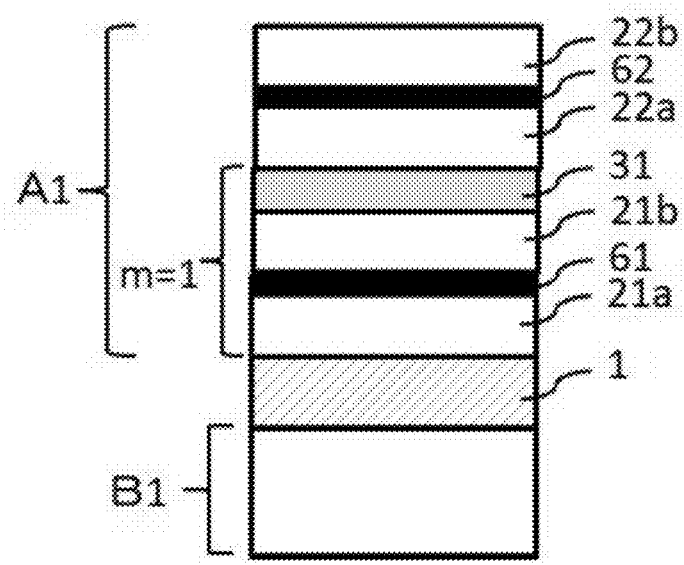
FIG. 7 shows a longitudinal section view of a still further example of a configuration of the magnetoresistance effect element of the present invention.

FIG. 7 shows a configuration of Embodiment 7 of the present invention. The configuration of the magnetoresistance effect element includes reference layer (B1) first non-magnetic layer (1)/magnetic layer (21a)/non-magnetic sub-insertion layer (61)/magnetic layer (21b)/first non-magnetic insertion layer (31)/magnetic layer (22a)/non-magnetic sub-insertion layer (62)/magnetic layer (22b) sequentially arranged adjacent to one another. The magnetic layer (21a)/non-magnetic sub-insertion layer (61)/magnetic layer (21b)/first non-magnetic insertion layer (31)/magnetic layer (22a)/non-magnetic sub-insertion layer (62)/magnetic layer (22b) configure the recording layer (A1).

At least the interface of the first non-magnetic layer (1)/magnetic layer (21a) has interfacial magnetic anisotropy in a perpendicular direction. Further, a magnetostatic interaction becomes dominant between the magnetic layer (21b) and the magnetic layer (22a), and a ferromagnetic coupling is established therebetween via magnetostatic coupling.

The details of Embodiment 7 are the same as those of Embodiment 1 except for the following description.

The non-magnetic sub-insertion layer (61 or 62) includes a non-magnetic element such as W, Ta, Hf, Zr, Nb, Mo, Ti, V, Cr, Si, Al, B, Pd, or Pi. The non-magnetic sub-insertion layer also has a role of absorbing B or the like in the magnetic layer adjacent to the interface thereof, and inducing the interfacial magnetic anisotropy in a direction perpendicular to a film surface. For this reason, preferable is an element of a bcc (body-centered cubic lattice) structure, having a large atomic radius, and a relatively larger lattice slicing. Out of these, W, Ta, Hf, Zr, Nb, Mo, Ti, V, or the like of bcc is preferable, and W or Ta is more preferable.

Each film thickness of the non-magnetic sub-insertion layers (61 and 62) is adjusted to the range of a thickness that absorbs B or the like in the magnetic layer adjacent to the interface, and causes perpendicular magnetic anisotropy, and a thinness that causes exchange coupling to act between the two magnetic layers. For example, the film thickness is more preferably adjusted within the range of 0.2 nm to 0.7 nm.

Incidentally, when either film thickness of the nonmagnetic sub-insertion layers (61 and 62) becomes about 0.2 nm or less, the sputtering time is adjusted, to manufacture a layer with a film thickness equivalent to around the atom size, or smaller. For this reason, either the one including continuous layers or the one including discontinuous layers are included. Even in the case of discontinuous layers, it is possible to have easily-magnetized axis in a perpendicular direction so long as the lattice has a space that absorbs B or the like in the magnetic layer.

The magnetic layer (21a, 21b, 22a, or 22b) includes at least any of Co or Fe, and may farther include a 3d ferromagnetic transition metal such as Nt.

Further, the magnetic layer (21a, 21b, 22a, or 22b) may farther include a non-magnetic element such as W, Ta, Hf, Zr, Nib, Mo, Ti, V, Cr, Si, Al, B, Pd, or Pt. Out of these, B and V are also preferable from the viewpoint of ease of handling. The non-magnetic elements can reduce the saturation magnetization ($M_s$) of the magnetic layer.

Specific examples thereof may include but are not limited to Co, CoFe, CoB, Fe, FeB, and CoFeB. Any material is acceptable so long as it makes magnetostatic interaction dominant, and establishes a ferromagnetic coupling between the magnetic layers (21b and 22a), and has interfacial magnetic anisotropy in a direction perpendicular to a film surface.

The total of the film thicknesses of the magnetic layer s (21a and 21b), and the total of the film thicknesses of the magnetic layers (22a and 22b) each preferably fall within the range of 0.3 nm to 3.0 nm, and more preferably fall within the range of 0.5 nm to 2.5 nm.

Embodiment 8

Figure 8:
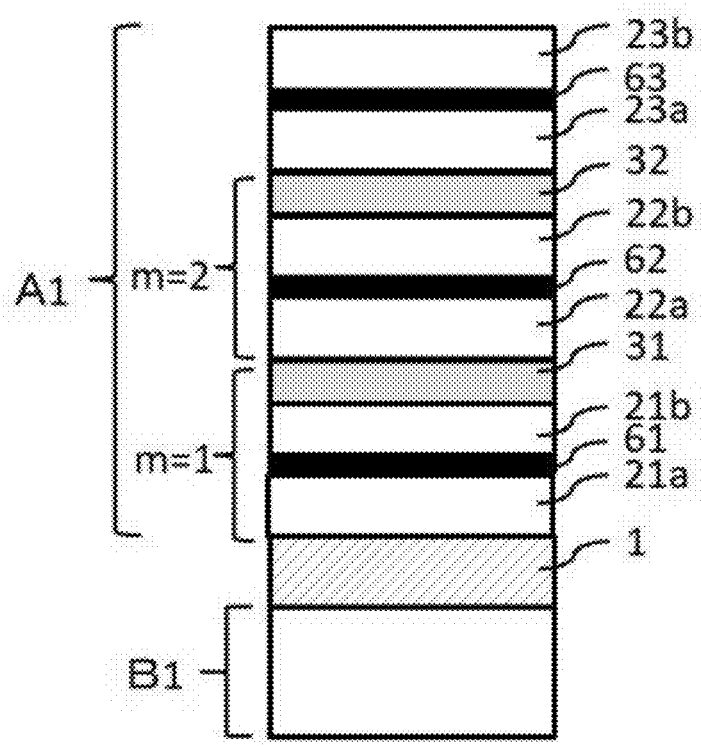
FIG. 8 shows a longitudinal section view of a further example of a configuration of the magnetoresistance effect element of the present invention.

FIG. 8 shows a configuration of Embodiment 8 of the present invention. The configuration of the magnetoresistance effect element includes reference layer (B1)/first non-magnetic layer (1)/magnetic layer (21a)/non-magnetic sub-insertion layer (61)/magnetic layer (21b)/first non-magnetic insertion layer (31)/magnetic layer (22a)/non-magnetic sub-insertion layer (62)/magnetic layer (22b)/second non-magnetic insertion layer (32)/magnetic layer (23a)/non-magnetic sub-insertion layer (63)/magnetic layer (23b) arranged sequentially adjacent to one another. The magnetic layer (21a)/non-magnetic sub-insertion layer (61)/magnetic layer (21b)/first non-magnetic insertion layer (31)/magnetic layer (22a)/non-magnetic sub-insertion layer (62)/magnetic layer (22b)/second non-magnetic insertion layer (32)/magnetic layer (23a)/non-magnetic sub-insertion layer (63)/magnetic layer (23b) configure the recording layer (A1).

At least the interface of the first non-magnetic layer (1)/magnetic layer (21a) has interfacial magnetic anisotropy in a perpendicular direction. Further, a magnetostatic interaction becomes dominant between the magnetic layer (21b) and the magnetic layer (22a), and between the magnetic layer (22b) and the magnetic layer (23a), and a ferromagnetic coupling is established therebetween via magnetostatic coupling.

The details of Embodiment 8 are the same as those of Embodiment 2 and Embodiment 7 except for the following description.

The non-magnetic sub-insertion layer (63) includes a non-magnetic element such as W, Ta, Hf, Zr, Nb, Mo, Ti, V, Cr, Si, Al, B, Pd, or Pt. The non-magnetic sub-insertion layer also has a role of absorbing B or the like in the magnetic layer adjacent to the interface thereof, and inducing the interfacial magnetic anisotropy in a direction perpendicular to a film surface. For this reason, preferable is an element of a bcc (body-centered cubic lattice) structure, having a large atomic radius, and a relatively larger lattice spacing. Out of these, W, Ta, Hf, Zr, Nb, Mo, Ti, V, or the like of bcc is preferable, and W or Ta is more preferable.

The film thickness of the non-magnetic sub-insertion layer (63) is adjusted to the range of a thickness that absorbs B or the like in the magnetic layer adjacent to the interface, and cause perpendicular magnetic anisotropy, and a thinness that causes exchange coupling to act between the two magnetic layers. For example, the film thickness is more preferably adjusted within the range of 0.2 nm to 0.7 nm.

The magnetic layer (23a or 23b) includes at least any of Co or Fe, and may further include a 3d ferromagnetic transition metal such as Ni.

Further, the magnetic layer (23a or 23b) may further include a non-magnetic element such as W, Ta, Hf, Zr, Nb, Mo, Ti, V, Cr. Si, Al, B, Pd, or Pt. Out of these, B and V are also preferable from the viewpoint of ease of handling. The non-magnetic elements can reduce the saturation magnetisation ($M_s$) of the magnetic layer.

Specific examples thereof may include but are not limited to Co, CoFe, CoB, Fe, FeB, and CoFeB. Any material is acceptable so long as it makes magnetostatic interaction dominant, and establishes a ferromagnetic coupling between the magnetic layers (22b and 23a), and has interfacial magnetic anisotropy in a direction perpendicular to a film surface.

The total of the film thicknesses of the magnetic layers (23a and 23b) preferably fells within the range of 0.3 nm to 3.0 nm, and more preferably fall within the range of 0.5 nm to 2.5 nm.

Embodiment 9

Figure 9:
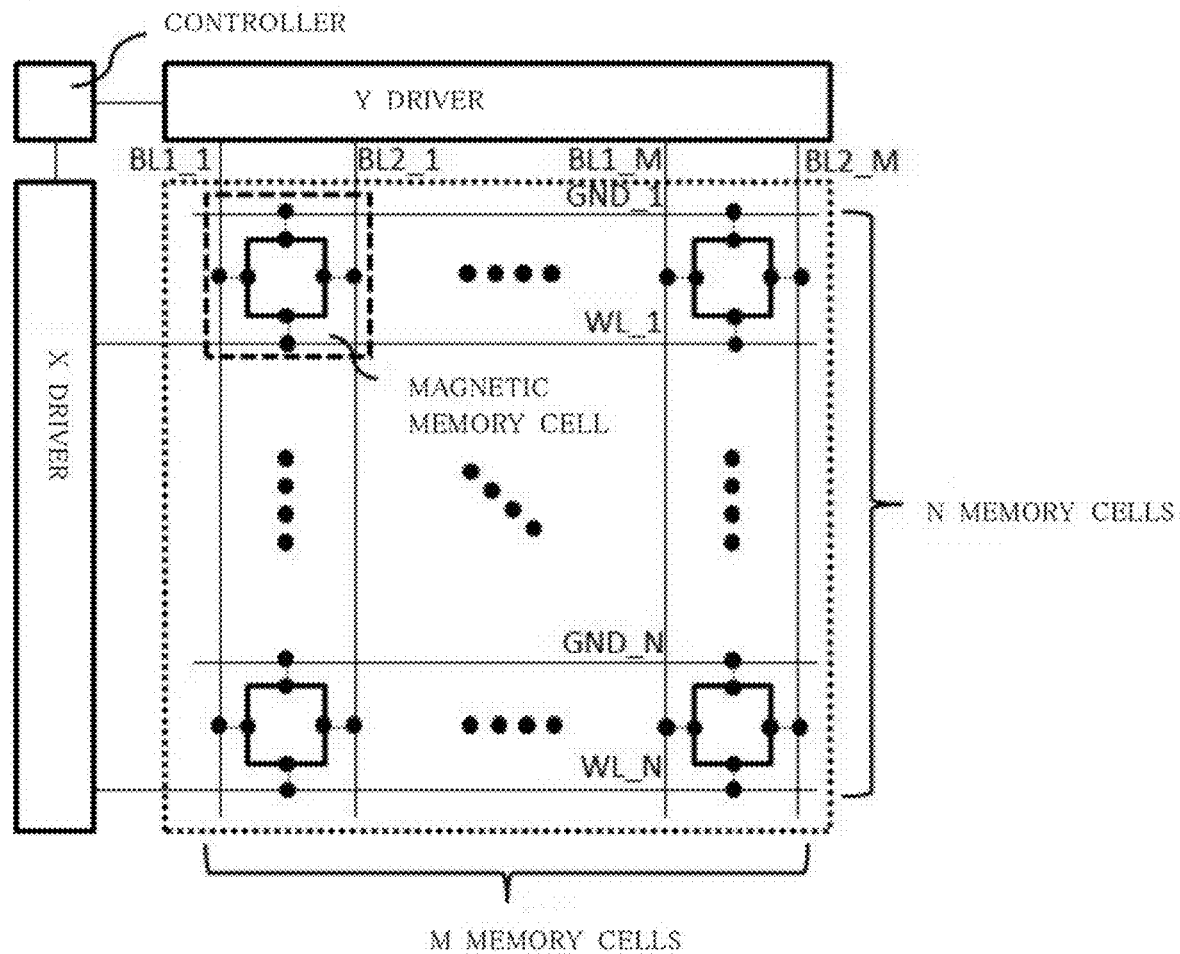
FIG. 9 is one example of a block view of a magnetic memory including a plurality of magnetoresistance effect elements of the present invention arranged therein.

FIG. 9 shows one example a magnetic memory including a plurality of magnetic memory cells hating each configuration of Embodiments 1 to 8 as Embodiment 9.

The magnetic memory includes a memory cell array, an X driver, a Y driver, and a controller. The memory cell array has magnetic memory cells arranged in an array. The X driver is connected to a plurality of word lines (WL), and the Y driver is connected to a plurality of bit lines (BL), functioning as reading means and writing means, respectively.

REFERENCE SIGNS LIST

1 First non-magnetic layer
21, 22, 23, . . . , 2n Magnetic layer
2a, 2b, 21a, 21b, 22a, 22b, 23a, 23b Magnetic layer
31, 32, . . . , 3(n-1) Non-magnetic insertion layer
4 Second nonmagnetic layer
5 Third non-magnetic layer
6, 61, 62, 63 Nan-magnetic sub-insertion layer
A1 Recording layer
B1 Reference layer
BL1 First bit line
BL2 Second bit line
GND Ground line
T1 First terminal
T2 Second terminal
T3 Third terminal
Tr1 First transistor
Tr2 Second transistor
WL Word line

The invention claimed is:

1. A magnetoresistance effect element, comprising:
a reference layer;
a first non-magnetic layer disposed adjacent to the reference layer;
a first magnetic layer disposed adjacent to the first non-magnetic layer on an opposite side thereof to the reference layer;
a first non-magnetic insertion layer disposed adjacent to the first magnetic layer on an opposite side thereof to the first non-magnetic layer; and
a second magnetic layer disposed adjacent to the first non-magnetic insertion layer on an opposite side thereof to the first magnetic layer, wherein
the first magnetic layer, the first non-magnetic insertion layer, and the second magnetic layer configure a recording layer,
the magnetoresistance effect element further comprising a second nonmagnetic layer adjacent to the recording layer on an opposite side thereof to the first non-magnetic layer, and wherein
the first non-magnetic layer and the second non-magnetic layer include oxygen,
the first non-magnetic insertion layer is configured of a material including oxygen, and has a film thickness of 0.7 nm or more and 1.1 nm or less,
the recording layer has an element size of 50 nm or less, and
a magnetostatic coupling is established between the first magnetic layer and the second magnetic layer due to a magnetostatic interaction becoming dominant.

2. The magnetoresistance effect element according to claim 1, wherein the recording layer has a structure in which n (n≥3) magnetic layers and n-1 non-magnetic insertion layers are laminated alternately to be adjacent to one another, and a first magnetic layer is disposed adjacent to the first non-magnetic layer, and
a magnetostatic coupling is established between an m-th (1≤m≤n-1) magnetic layer and an m+1-th magnetic layer each adjacent to the m-th non-magnetic insertion layer due to a magnetostatic interaction becoming dominant.

3. The magnetoresistance effect element according to claim 1, wherein a material of the non-magnetic insertion layer is selected from MgO, Al—O, Ta—O, W—O, or Hf—O.

4. The magnetoresistance effect element according to claim 1, wherein a film thickness of each of the magnetic layers is 0.3 nm or more and 2.3 nm or less.

5. The magnetoresistance effect element according to claim 1, wherein the material of the magnetic layer includes at least Fe or Co.

6. The magnetoresistance effect element according to claim 1, wherein each of the magnetic layers includes a non-magnetic sub-insertion layer in the magnetic layer.

7. A magnetoresistance effect element, comprising:
a reference layer;
a first non-magnetic layer disposed adjacent to the reference layer;
a recording layer disposed adjacent to the first non-magnetic layer on an opposite side thereof to the reference layer; and
a second non-magnetic layer disposed adjacent to the recording layer on an opposite side thereof to the first non-magnetic layer, wherein
the first non-magnetic layer and the second non-magnetic layer include oxygen,
the recording layer has an element size of 50 nm or less, and has a structure in which n (n≥2) magnetic layers and n-1 non-magnetic insertion layers are laminated alternately to be adjacent to one another, and a first magnetic layer is disposed adjacent to the first non-magnetic layer, and the non-magnetic insertion layer is configured of a material including oxygen, and has a film thickness of 0.7 nm or more and 1.1 nm or less.

8. A magnetic memory comprising the magnetoresistance effect element according to claim 1.

9. The magnetoresistance effect element according to claim 2, wherein a material of the non-magnetic insertion layer is selected from MgO, Al—O, Ta—O, W—O, or Hf—O.

10. The magnetoresistance effect element according to claim 2, wherein a film thickness of each of the magnetic layers is 0.5 nm or more and 2.5 nm or less.

11. The magnetoresistance effect element according to claim 3, wherein a film thickness of each of the magnetic layers is 0.5 nm or more and 2.5 nm or less.

12. The magnetoresistance effect element according to claim 2, wherein the material of the magnetic layer includes at least Fe or Co.

13. The magnetoresistance effect element according to claim 3, wherein the material of the magnetic layer includes at least Fe or Co.

14. The magnetoresistance effect element according to claim 4, wherein the material of the magnetic layer includes at least Fe or Co.

15. The magnetoresistance effect element according to claim 2, wherein each of the magnetic layers includes a non-magnetic sub-insertion layer in the magnetic layer.

16. The magnetoresistance effect element according to claim 3, wherein each of the magnetic layers includes a non-magnetic sub-insertion layer in the magnetic layer.

17. The magnetoresistance effect element according to claim 4, wherein each of the magnetic layers includes a non-magnetic sub-insertion layer in the magnetic layer.

18. The magnetoresistance effect element according to claim 5, wherein each of the magnetic layers includes a non-magnetic sub-insertion layer in the magnetic layer.

19. A magnetic memory comprising the magnetoresistance effect element according to claim 7.

* * * * *